(12) United States Patent
Chiu

(10) Patent No.: US 6,228,679 B1
(45) Date of Patent: May 8, 2001

(54) APPARATUS AND METHOD FOR AUTOMATING THE UNDERFILL OF FLIP-CHIP DEVICES

(75) Inventor: Anthony M. Chiu, Richardson, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 09/289,883

(22) Filed: Apr. 9, 1999

Related U.S. Application Data

(62) Division of application No. 08/977,078, filed on Nov. 24, 1997, now Pat. No. 5,942,798.

(51) Int. Cl.[7] .......................... H01L 21/44; H01L 21/48; H01L 21/50
(52) U.S. Cl. .......................... 438/108; 438/118; 438/612
(58) Field of Search .................. 438/106, 108, 438/118, 612

(56) References Cited

U.S. PATENT DOCUMENTS

| 4,161,740 | 7/1979 | Frey .................................. 357/36 |
| 4,218,701 | 8/1980 | Shirasaki ............................. 357/72 |
| 4,627,151 | 12/1986 | Mulholland et al. ................ 29/569 R |
| 4,888,307 | 12/1989 | Spairisano et al. .................. 437/216 |
| 5,041,395 | 8/1991 | Steffen ................................ 437/206 |
| 5,073,816 | 12/1991 | Wakefield et al. ................... 357/74 |
| 5,203,076 | * 4/1993 | Banerji et al. . |
| 5,450,283 | 9/1995 | Lin et al. ............................. 361/704 |
| 5,737,191 | 4/1998 | Horiuchi et al. .................... 361/764 |
| 6,048,656 | * 4/2000 | Akram et al. . |

* cited by examiner

Primary Examiner—Kevin M. Picardat
Assistant Examiner—D. M. Collins
(74) Attorney, Agent, or Firm—Theodore E. Galanthay; Lisa K. Jorgenson; Dan Venglarik

(57) ABSTRACT

An apparatus and method for underfilling a silicon chip (16) to a substrate (12) by depositing an underfill dam (18) on the surface (20) of the substrate (12) prior to addition of the underfill material (14), is disclosed. A bead of underfill material (14) is provided on the substrate (12) about the periphery of the silicon chip (16), within the underfill dam (18). The underfill material (14) fills the gap (22) between the electrical contacts, the substrate (12) and the silicon chip (16) by capillary action and differential pressure created by a vacuum system (40).

19 Claims, 3 Drawing Sheets

APPARATUS AND METHOD FOR AUTOMATING THE UNDERFILL OF FLIP-CHIP DEVICES

This is a Division of application Ser. No. 08/977,078, filed Nov. 24, 1997, currently U.S. Pat. No. 5,942,798.

BACKGROUND OF THE INVENTION

Without limiting the scope of the invention, its background is described in connection with the packaging of integrated circuits, as an example.

Bumped silicon chips, also known as flip-chips, use a solder bump or ball to solder the electrical connections that interconnect integrated circuits. Flip-chip arrangements avoid the problems of breakage and lack of planarity encountered with conventional integrated circuit packages that are wire-bonded. Solder bumps or balls allow direct coupling between the pads on the silicon chip and matching contacts on the substrate. The flip-chip is aligned to the substrate and all connections are made simultaneously by reflowing the solder.

The use of solder bumps on the underside of silicon chips has led to the need to underfill the gap between the silicon chip and the substrate following reflow of the solder bumps. The underfill increases the mechanical integrity and reliability of integrated circuit packages, but requires a time consuming series of passes in which underfill polymer in liquid form is added to the periphery of the silicon chip. With each addition of underfill polymer, the underfill is built-up over the solder bumps in the gap by capillary action. The entire sequence can take up to 3 minutes per integrated circuit package.

Typically, an underfill polymer is dispensed onto each of the four adjacent sides of bonded flip-chip integrated circuits (ICs). The liquid underfill polymer is drawn into the gap by capillary action. The duration of each flow cycle can last as long as twenty minutes depending on the number of passes and the size of the gap. Furthermore, the sides on which the underfill polymer out-flow are substantially less homogeneous than the in-flow side. A non-symmetric underfill geometry causes stress gradients leading to premature failures of the integrated circuit package.

The inability to provide a uniform underfill has frustrated attempts to provide flip-chip mounting techniques that are reliable in a mass production environment. The types of flip-chip automation that would benefit from a reliable means of dispersing underfill polymer include: in-line automation, repeatable automatic process control, high throughput productions of flip-chips on substrates such as printed circuit boards (PCB), flip-chip multi-chip modules, or carriers to form flip-chip chip carriers, and high volume production of flip-chip chip carriers on PC boards and ceramic substrates.

Yet another solution to the problem of improving the speed of automation of underfilling the gap between the silicon chip and the substrate in flip-chip configuration has been the use of alternating cycles of vacuum and pressure. U.S. Pat. No. 5,203,076 issued to Banjeri, et al. discloses such a method. The Banjeri patent, however, fails to address the need to increase the efficiency in the automation process, as liquid underfill polymer must still be added in repeated cycles.

U.S. Pat. No. 5,073,816 (INMOS Limited) discloses an apparatus and method for packaging semiconductor devices aimed at reducing package size and providing improved heat dissipation over the packages in the prior art. While the specification describes an apparatus and method for flip-chip packaging, it fails to address the need to automate the underfill process.

A need has arisen for a simple, effective apparatus and method for providing a uniform liquid underfill polymer in a manner that avoids the difficulties of prior infiltration methods. A need has also arisen for increasing the speed and automation of the underfill process.

SUMMARY OF THE INVENTION

An object of the present invention is to a provide a simple, effective apparatus and method for dispensing a liquid underfill polymer under an integrated circuit. The present invention also increases the speed and automation of the underfill process. More particularly, the present invention comprises an integrated circuit package having a substrate and a silicon chip mounted on the substrate. The space between the substrate surface and the silicon chip defines a gap which is underfilled with a liquid underfill polymer. A liquid underfill dam is disposed on the surface of the substrate. The underfill dam serves to create a reservoir for the liquid underfill polymer.

The liquid underfill polymer can be, for example, an epoxy or a plastic polymer. In another embodiment of the present invention, the underfill dam is made of, for example, an epoxy or a plastic that is molded or extruded onto the substrate surface.

The present invention, disclosed herein, also comprises a method of attaching ah integrated circuit package to a substrate comprising the steps of, disposing an underfill dam on a substrate and electrically interconnecting a silicon chip on the substrate. The distance between the substrate and the silicon chip define a gap, which is filled by placing a bead of underfill material on the substrate about the periphery of the silicon chip and within the underfill dam.

In one embodiment of the present invention, the method of the present invention may further comprise the step of applying at least a partial vacuum to the integrated circuit package. Applying a vacuum removes air entrapped in the gap between the silicon chip and the substrate by bubbling the entrapped air through the underfill material. In yet another embodiment of the present invention, the step of providing a bead of underfill material comprises providing a sufficient amount of underfill material to completely fill the gap in one step. Once the gap has been filled with the liquid underfill material, the integrated circuit package having an underfill dam may be stored, handled or further processed by curing the liquid underfill polymer into a solid underfill.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
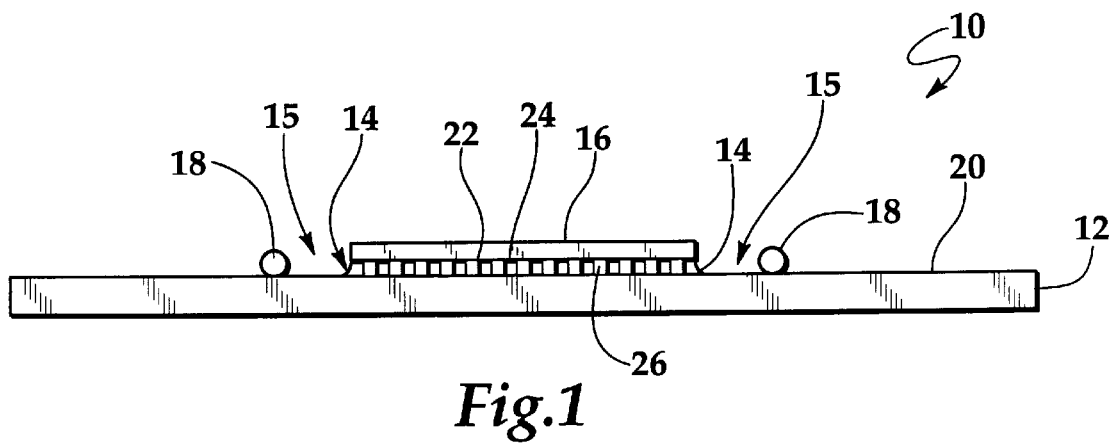
FIG. 1 is a cross-sectional view of an underfill retaining apparatus for a solder-bumped flipped integrated circuit and substrate in accordance with the present invention.

Referring to FIG. 1, an integrated circuit package 10 is shown mounted on a substrate 12 using solder bumps 24. An example of a substrate 12 is a printed circuit board (PCB), as described in U.S. Pat. No. 4,940,181, incorporated herein by reference.

In a flip-chip package, such as integrated circuit package 10, a plurality of solder bumps 24 are disposed on the substrate 12 and make electrical contact with pads on the substrate 12. The array of solder bumps 24 is normally arranged in a square or other geometric pattern suitable to receive the corresponding integrated circuit package 10, or the like. As can be seen in FIG. 1, with this mounting arrangement, a gap 22 is formed between the top surface 20 of the substrate 12 and the bottom surface 26 of the silicon chip 16, which varies from 2–6 mils.

To fill the gap 22, an infiltrant or underfill polymer is dispensed between at least one of the edges of the silicon chip 16 and an underfill dam 18 of the integrated circuit package 10 in space 15. The underfill polymer comprises a liquid polymer of suitable viscosity. The underfill dam 18 allows the user to deposit, in one step or pass, sufficient underfill polymer to fill the gap 22 in an automated assembly line rather than in multiple passes. The underfill dam 18 prevents the liquid underfill polymer from spilling over the sides of the substrate 12 while the integrated circuit package awaits curing.

By providing an underfill dam 18, the user can process more integrated circuits using the same equipment that is currently used. In operation, the underfill dam 18 may be a polymer, such as an epoxy, that is deposited on the substrate 12 prior to, concurrent with or after the silicon chip 16 has been soldered onto the substrate 12. Liquid underfill polymer is deposited into the gap 22 and capillary action draws the liquid underfill polymer into the gap 22. During the fill stage, the integrated circuit package 10 can be handled or stored prior to curing. Furthermore, a large number of integrated circuit packages 10 can be processed. using the one-step fill method using the apparatus of the present invention while others are stored or cured.

Figure 2:
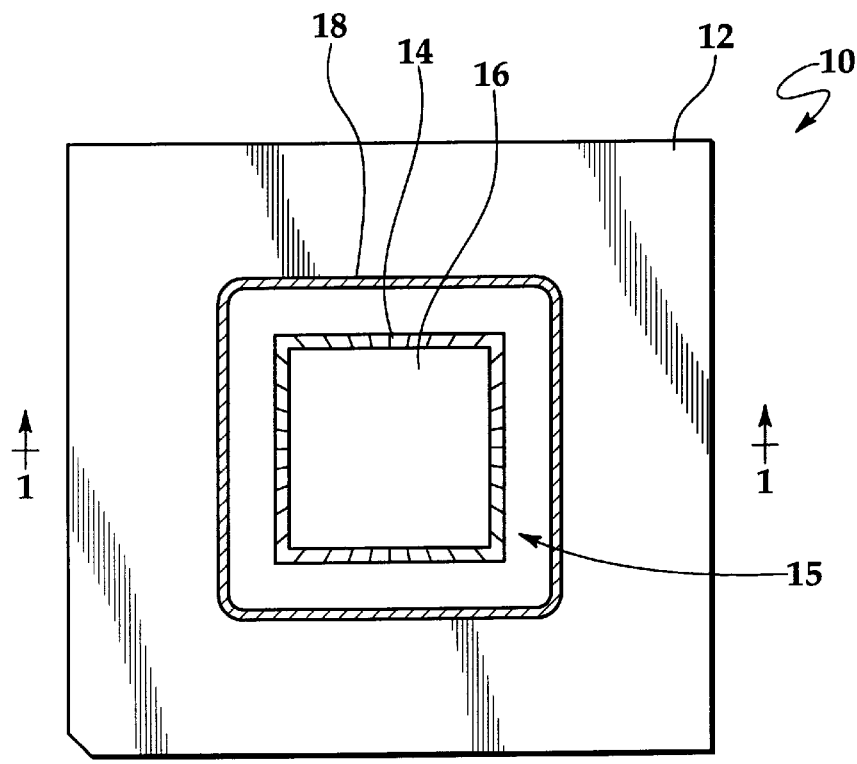
FIG. 2 is a top view of the solder-bumped flipped integrated circuit and substrate of FIG. 1.

FIG. 2 is a top view of the integrated circuit package 10, in which a silicon chip 16 has been soldered onto a substrate 12. In this embodiment, an underfill dam 18 is depicted as a generally square-shaped dam surrounding the space 15 and the silicon chip 16. The underfill dam 18 serves to restrain the liquid underfill polymer in a liquid state during storage and processing prior to curing. The actual height of the underfill dam 18 above the substrate 12 will depend on the size of the solder bumps 24, the height of the gap 22 and the amount of liquid underfill polymer that is applied to fill gap 22. Furthermore, the distance between the edge of the silicon chip 16 and the underfill dam 18 will depend on like considerations. As will be appreciated by those of skill in the art in light of the present disclosure, the actual shape of the underfill dam 18 may vary, e.g., depending on the specific requirements of the integrated circuit package. The space 15 has a residual coating of the polymer.

Figure 3:
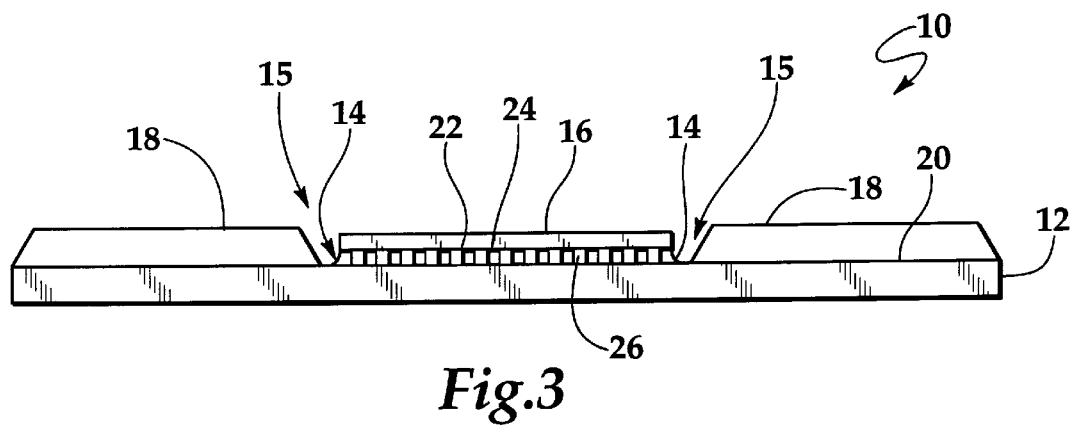
FIG. 3 is a cross-sectional view of the solder-bumped flipped integrated circuits and substrate.

FIG. 3 shows an alternative embodiment of the integrated circuit package 10 of the present invention in which the underfill dam 18 is a molded cover that creates a space 15 that extends from the underfill 14 to the edge of the substrate 12. Using an underfill dam 18 that is molded onto the substrate 12 requires less processing than the underfill dam 18 depicted in FIG. 1, and can be molded or extruded onto the substrate 12 prior to reflow of the solder bumps 24 between silicon chip 16 and pads on the substrate 12. The molded underfill dam 18 also has the advantage that is can be provided with thermal properties that improve heat dissipation, as known to those of skill in the art.

Figure 4:
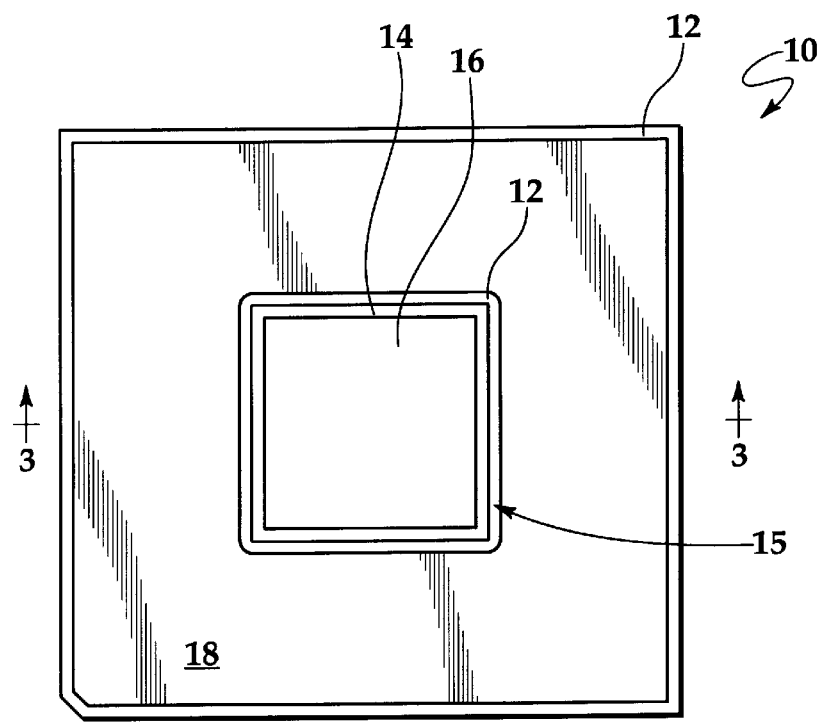
FIG. 4 is a top view of the solder-bumped flipped integrated circuit and substrate of FIG. 3.

FIG. 4 is a top view of the integrate circuit package 10 depicted in FIG. 3, having a substrate 12, silicon chip 16, underfill 14, space 15 and underfill dam 18. The underfill dam 18 is shown molded from the edge of the underfill 14 to the edge of the substrate 12.

Figure 5:
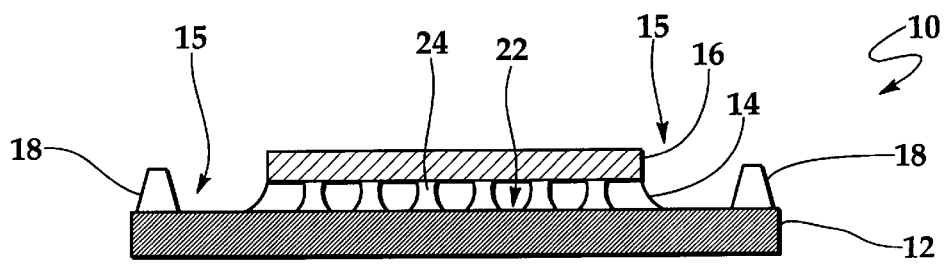
FIG. 5 is a cross sectional view of another embodiment of the underfill retaining apparatus for a solder-bumped flipped integrated circuit and substrate.

FIG. 5 shows yet another embodiment of the underfill dam 18 of the present invention in which the underfill dam 18 is molded onto the substrate 12, and is trapezoidal in shape. The trapezoidal underfill dam 18 shares the advantages of the extruded rounded underfill dam 18 depicted in FIG. 1 and the molded underfill dam of FIG. 3 as it relates to retaining the liquid underfill polymer prior to curing. It also has the advantage provided by the rounded underfill dam 18 of FIG. 1 in that is requires small amounts of polymer or plastic, saving resources and the environment. At the same time it has the advantage of the molded underfill dam 18 depicted in FIG. 3, because it can be extruded or molded using standard single-step molding techniques.

Figure 6:
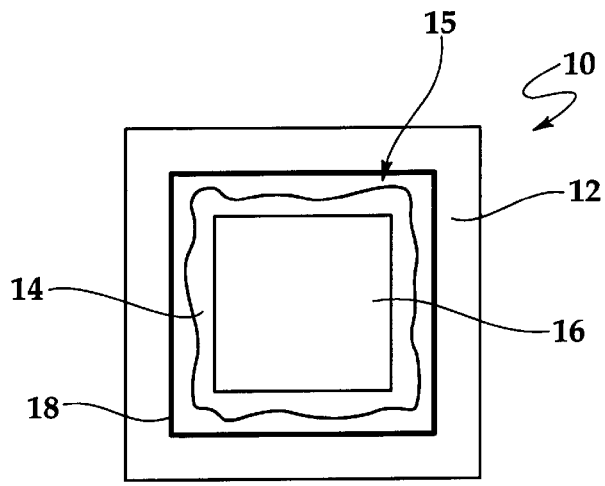
FIG. 6 is a top view of the underfill retaining apparatus for a solder-bumped flipped integrated circuit and substrate.

FIG. 6 is a top view of the integrated circuit package 10 of the present invention in which the underfill 14 is still in its liquid state and the liquid underfill polymer is filling the gap 22 by capillary action. Within space 15 can be seen the excess liquid underfill polymer that forms a residual polymer coating once the polymer has been cured. The liquid underfill dam 18 serves as a reservoir of liquid underfill polymer while capillary action draws the liquid underfill polymer into the gap 22. At this stage the integrated circuit package 10 can be handled and stored pending curing of the liquid underfill polymer.

Figure 7:
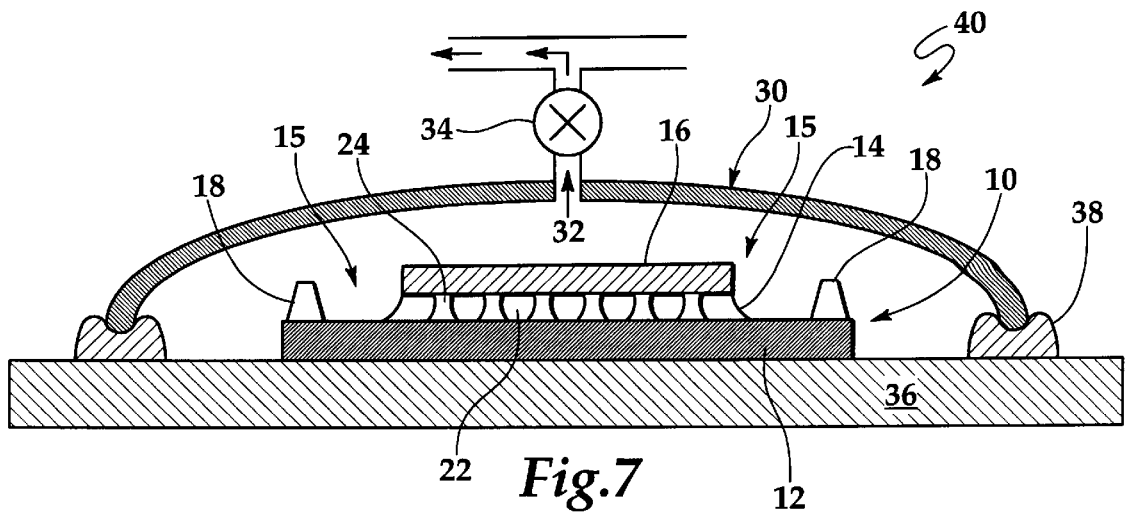
FIG. 7 is a cross-sectional. view of a vacuum application step for the solder-bump flipped integrated circuit and substrate.

In order to insure that the underfill 14 fills the gap 22 more completely further processing may be required. As depicted in FIG. 7, a vacuum system 40 has a vacuum shield 30 that is positioned over the integrated circuit package 10 on, for example, a table 36. A seal 38 is positioned between the table 36 and the vacuum shield 30. Vacuum 32 is continuously applied as controlled by a vacuum valve 34 and entrapped air that was in the gap 22, is evacuated by bubbling past the underfill 14 prior to curing the liquid underfill polymer into a solid underfill 14.

In operation, an underfill dam 18 is used to retain the liquid underfill polymer in the gap 22 during processing. To reduce the possibility of bubbles forming or remaining in the underfill 14, vacuum 32 is applied to evacuate bubbles from the gap 22 under the silicon chip 16 of the integrated circuit package 10. A vacuum of 50 mTorr is generally required to evacuate bubbles. This process enables the gap 22 to be completely underfilled, resulting in a reduced infiltration cycle time and eliminating any voids in the underfill 14 by providing a uniform underfill 14. The position of the vacuum 32 can be anywhere where the vacuum does not draw the liquid underfill polymer into the vacuum pump 34.

Additionally, the one-step addition of liquid underfill polymer followed by, or prior to, the application of vacuum 32 uses existing in-line automation technology, repeatable automatic process control, and high through-put production of integrated circuit packages 10 on any suitable substrate. It also allows the handling and storage of the integrated circuit packages 10 during processing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of attaching an integrated circuit package to a substrate comprising:

mounting a silicon chip on the substrate, the distance between the substrate and the silicon chip defining a gap;

disposing an underfill dam on a substrate spaced apart from the silicon chip; and providing a bead of underfill material on the substrate about the periphery of the silicon chip and within the underfill dam, wherein the bead comprises an amount of underfill sufficient to at least fill the gap, wherein the underfill dam is of sufficient height to prevent the bead of underfill from overflowing the underfill dam.

2. The method of claim 1 further comprising:

applying at least a partial vacuum to the integrated circuit package to remove entrapped air in the gap between the silicon chip and the substrate by bubbling the entrapped air through the underfill material.

3. The method of claim 2 wherein the step of applying at least a partial vacuum comprises positioning the integrated circuit package within a vacuum chamber.

4. The method of claim 2 wherein the step of applying at least a partial vacuum comprises controlling the rate of the vacuum to provide a continuous evacuation rate.

5. The method of claim 1 wherein the step of providing a bead of underfill material comprises providing a sufficient underfill material to completely fill the gap in one step.

6. A method of underfilling an integrated circuit package to a substrate comprising:

mounting a silicon chip on the substrate, the distance between the substrate surface and the silicon chip defining a gap;

disposing an underfill dam on a substrate;

providing a bead of underfill material sufficient to fill the gap on the substrate about the periphery of the silicon chip and within the underfill dam; and exposing the integrated circuit package to a partial vacuum.

7. The method of claim 6 further comprising the step of curing the integrated circuit package.

8. The method of claim 6 wherein the underfill dam is further defined as being a thermo-setting epoxy.

9. The method of claim 6 wherein the underfill dam is further defined as being a thermal plastic.

10. A method of underfilling an integrated circuit, comprising:

forming an underfill dam on a substrate around and spaced apart from a silicon chip mounted on the substrate; and depositing a bead of underfill material at least sufficient to fill a gap between the substrate and the silicon chip on the substrate about the periphery of the silicon chip between the silicon chip and the underfill dam, wherein the bead of underfill material is not enough to overflow the underfill dam when deposited on the substrate surface between the underfill dam and the silicon chip.

11. The method of claim 10, wherein the step of forming an underfill dam on a substrate around and spaced apart from a silicon chip mounted on the substrate further comprises:

forming the underfill dam with a height sufficient to prevent an amount of underfill material adequate to at least fill the gap from overflowing the underfill dam when deposited on the substrate surface between the underfill dam and the silicon chip.

12. The method of claim 10, wherein the step of forming an underfill dam on a substrate around and spaced apart from a silicon chip mounted on the substrate further comprises:

forming the underfill dam from thermal plastic.

13. The method of claim 10, further comprising:

applying at least a partial vacuum to the underfill material to remove entrapped air in the gap between the silicon chip and the substrate.

14. The method of claim 10, wherein the step of depositing a bead of underfill material further comprises:

depositing an thermo-setting epoxy resin.

15. The method of claim 14, further comprising:

after filling the gap, curing the epoxy resin.

16. The method of claim 10, further comprising:

mounting the silicon chip to pads on the substrate.

17. The method of claim 1, wherein the step of disposing an underfill dam on a substrate spaced apart from the silicon chip further comprises:

forming the underfill dam about the periphery of the silicon chip.

18. The method of claim 1, wherein the step of disposing an underfill dam on a substrate spaced apart from the silicon chip is performed prior to the step of mounting a silicon chip on the substrate.

19. The method of claim 1, further comprising:

after forming the bead of underfill material, storing the integrated circuit package before curing the underfill material during later processing.

* * * * *